US012687599B2

(12) United States Patent
Hachitani et al.

(10) Patent No.: US 12,687,599 B2
(45) Date of Patent: Jul. 21, 2026

(54) NMR MEASUREMENT APPARATUS

(71) Applicant: JEOL Ltd., Tokyo (JP)

(72) Inventors: Kenichi Hachitani, Akishima (JP);
Nobuaki Nemoto, Akishima (JP);
Junpei Hamatsu, Akishima (JP);
Fumihiro Yamazaki, Akishima (JP);
Takayuki Suzuki, Akishima (JP)

(73) Assignee: JEOL Ltd., Tokyo (JP)

( * ) Notice: Subject to any disclaimer, the term of this patent is extended or adjusted under 35 U.S.C. 154(b) by 810 days.

(21) Appl. No.: 17/974,678

(22) Filed: Oct. 27, 2022

(65) Prior Publication Data

US 2023/0135564 A1     May 4, 2023

(30) Foreign Application Priority Data

Oct. 28, 2021     (JP) ................................ 2021-176250

(51) Int. Cl.
*G01R 33/46*          (2006.01)
*G01R 33/36*          (2006.01)
(52) U.S. Cl.
CPC ......... *G01R 33/46* (2013.01); *G01R 33/3607* (2013.01); *G01R 33/3635* (2013.01)
(58) Field of Classification Search
CPC ................ G01R 33/46; G01R 33/3607; G01R 33/3635; G01R 33/3664; G01N 24/08
See application file for complete search history.

(56) References Cited

U.S. PATENT DOCUMENTS

| | | | |
|---|---|---|---|
| 5,442,292 A | 8/1995 | Kolem et al. | |
| 2001/0049269 A1 | 12/2001 | Weiss et al. | |
| 2009/0286478 A1* | 11/2009 | Biber ................. | G01R 33/3607 455/41.2 |
| 2016/0187437 A1 | 6/2016 | Hachitani | |

FOREIGN PATENT DOCUMENTS

| | | |
|---|---|---|
| JP | H481082 U | 7/1992 |
| JP | 11352203 A | 12/1999 |
| JP | 200231673 A | 1/2002 |
| JP | 201025895 A | 2/2010 |
| JP | 2014119346 A | 6/2014 |
| JP | 201624118 A | 2/2016 |

OTHER PUBLICATIONS

English translation of JP2014119346A provided by Espacenet. (Year: 2026).*
Extended European Search Report issued in EP22202453.1 on Mar. 17, 2023.
Office Action issued in JP2021176250 on Oct. 10, 2023.
Office Action issued in EP22202453.1 on Apr. 16, 2025.

* cited by examiner

*Primary Examiner* — Rishi R Patel
(74) *Attorney, Agent, or Firm* — The Webb Law Firm

(57) ABSTRACT

In a frequency converter, a transmission signal having a first frequency component and a second frequency component is multiplied by a local signal, to thereby frequency-convert the transmission signal. In a power amplifier, the frequency-converted transmission signal is amplified. A demultiplexing circuit generates a first transmission signal and a second transmission signal from the amplified transmission signal. A controller is configured to set for a transmission section a frequency set suitable for two irradiation frequencies.

8 Claims, 12 Drawing Sheets

FIG. 2

|  | RF1 (MHz) | RF2 (MHz) | METHOD | F1 (MHz) | F2 (MHz) | F0 (MHz) |
|---|---|---|---|---|---|---|
| #1 | 60 | 150 | DIFFER-ENCE | 125 | 35 | 185 |
| #2 | 60 | 150 | DIFFER-ENCE | 115 | 25 | 175 |
| #3 | 560 | 600 | SUMMA-TION | 25 | 65 | 535 |
| #4 | 560 | 600 | SUMMA-TION | 85 | 125 | 475 |

F2:35
(MHz)

78

F0:185
(MHz)

77

F1:125
(MHz)

75

RF1:60
(MHz)

76

RF2:150
(MHz)

F1:115
(MHz)

85

F0:175
(MHz)

84

F2:25
(MHz)

83

RF2:150
(MHz)

82

RF1:60
(MHz)

Figure 11:
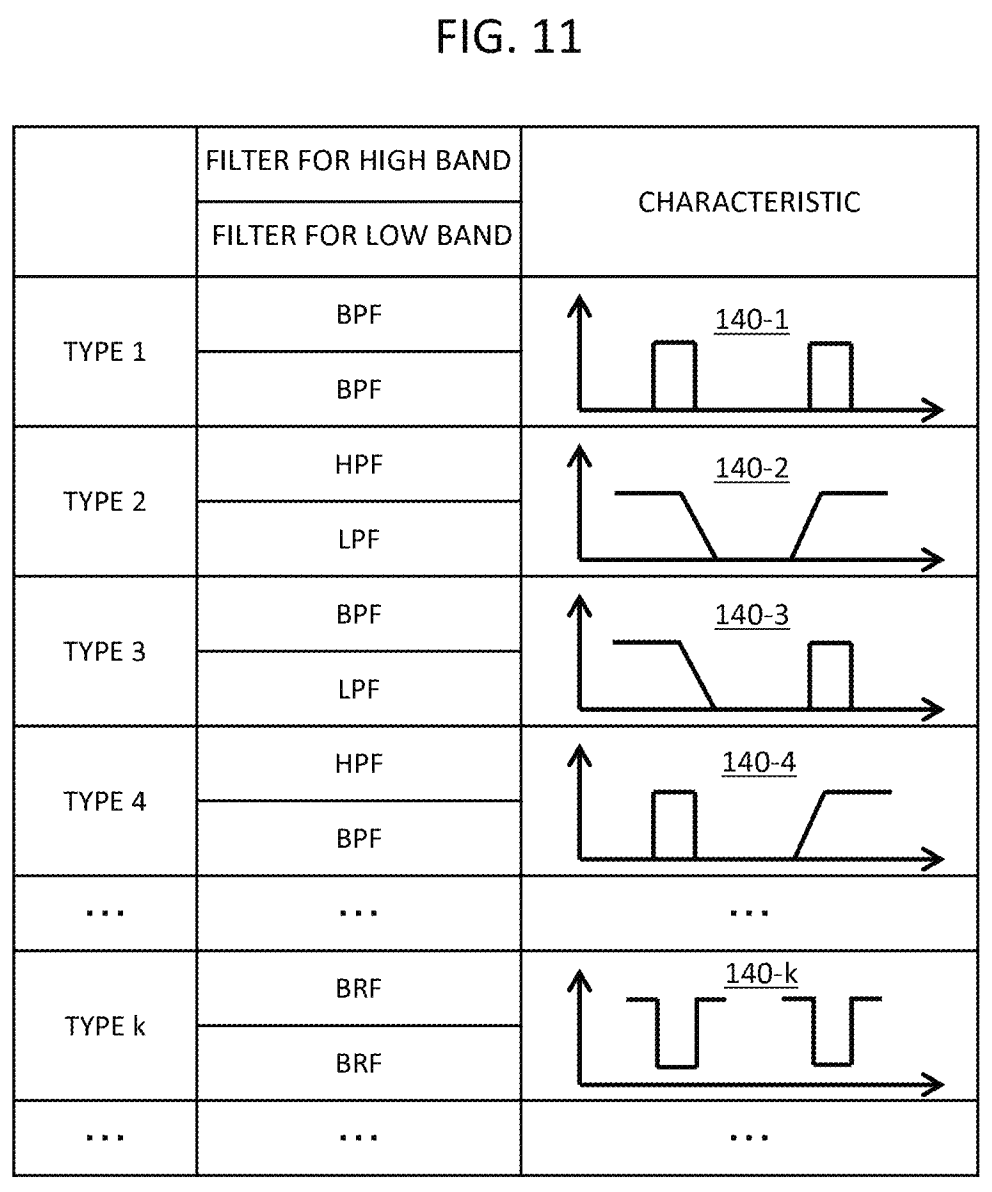

| | FILTER FOR HIGH BAND | FILTER FOR LOW BAND | CHARACTERISTIC |
|---|---|---|---|
| TYPE 1 | BPF | BPF | 140-1 |
| TYPE 2 | HPF | LPF | 140-2 |
| TYPE 3 | BPF | LPF | 140-3 |
| TYPE 4 | HPF | BPF | 140-4 |
| ... | ... | ... | ... |
| TYPE k | BRF | BRF | 140-k |
| ... | ... | ... | ... |

NMR MEASUREMENT APPARATUS

CROSS REFERENCE TO RELATED APPLICATION

This application claims priority to Japanese Patent Application No. 2021-176250 filed Oct. 28, 2021, the disclosure of which is hereby incorporated by reference in its entirety.

BACKGROUND OF THE DISCLOSURE

Field of the Disclosure

The present disclosure relates to an NMR measurement apparatus, and in particular to a technique for generating a plurality of transmission signals.

Description of Related Art

An NMR measurement apparatus is an apparatus which measures an NMR (Nuclear Magnetic Resonance) phenomenon which occurs in a sample. The NMR apparatus includes a spectrometer and a probe. The probe corresponds to a detector. The spectrometer includes a transmission section and a reception section.

Document 1 (JP 2016-24118 A) discloses an NMR measurement apparatus. A transmission section in the NMR measurement apparatus has a frequency converter. In a mixer in the frequency converter, a transmission signal is multiplied by a local signal from a local oscillator. The transmission signal after the frequency conversion, which is output from the frequency converter, is sent to the probe. Document 2 (JP 2002-31673 A) also discloses an NMR measurement apparatus. The NMR measurement apparatus has a demultiplexing circuit (multi-channel selection and routing unit) which generates a plurality of transmission signals from a single transmission signal.

Documents 1 and 2 do not disclose a combination of the frequency conversion technique and the demultiplexing technique. In particular, Documents 1 and 2 do not disclose a technique for generating a plurality of transmission signals while using a single local signal for frequency conversion.

In the NMR measurement, in some cases, simultaneous irradiation (or sequential irradiation) of a plurality of electromagnetic waves onto a sample becomes necessary. For example, when simultaneous performance of excitation of an observation nucleus and excitation of a peripheral nucleus for decoupling between the observation nucleus and the peripheral nucleus (operation for weakening an interaction) is desired, the sample is simultaneously irradiated with a plurality of electromagnetic waves having a plurality of different irradiation frequencies respectively suited to the objectives. If a plurality of transmission sections (for example, a plurality of power amplifiers and a plurality of frequency converters) are to be provided in parallel with each other for such irradiation of a plurality of electromagnetic waves, that is, for generation of a plurality of transmission signals having a plurality of different frequencies, the apparatus structure becomes complex, and the manufacturing cost is subsequently increased. In addition, if a plurality of reception sections (for example, a plurality of preamplifiers and a plurality of frequency converters) are to be provided in parallel with each other in correspondence to the plurality of transmission sections, the complication of the apparatus structure and the increase in the manufacturing cost are worsened.

An advantage of the present disclosure lies in enabling, in an NMR measurement apparatus, generation of a plurality of transmission signals having a plurality of different frequencies with a simple structure. Alternatively, an advantage of the present disclosure lies in setting, in an NMR measurement apparatus, of a suitable frequency conversion condition when a plurality of transmission signals are generated via frequency conversion.

SUMMARY OF THE DISCLOSURE

According to one aspect of the present disclosure, there is provided an NMR measurement apparatus comprising: a mixer that multiplies a transmission signal having a plurality of different frequency components by a local signal, to thereby generate a frequency-converted transmission signal; a power amplifier that amplifies the frequency-converted transmission signal, and outputs an amplified transmission signal; a demultiplexing circuit that has a plurality of filters having a plurality of different frequency characteristics, that allows the amplified transmission signal to pass through the plurality of filters so as to generate, in parallel with each other, a plurality of transmission signals having a plurality of different irradiation frequencies, and that outputs the plurality of transmission signals to an NMR detection circuit; and a controller configured to set a condition for generating the plurality of different irradiation frequencies as a condition for frequency conversion by the mixer.

BRIEF DESCRIPTION OF THE DRAWINGS

Embodiment(s) of the present disclosure will be described based on the following figures, wherein:

FIG. 2 is a diagram showing a plurality of frequency sets;

FIG. 3 is a diagram showing an example calculation of a frequency set in a first combination;

FIG. 4 is a diagram showing an example calculation of a frequency set in a second combination;

FIG. 5 is a diagram showing an example calculation of a frequency set in a third combination;

FIG. 11 is a diagram showing some specific examples of a demultiplexing circuit (combining circuit)

DESCRIPTION OF NON-LIMITING EMBODIMENTS OF THE DISCLOSURE

(1) Overview of Embodiment

Figure 1:
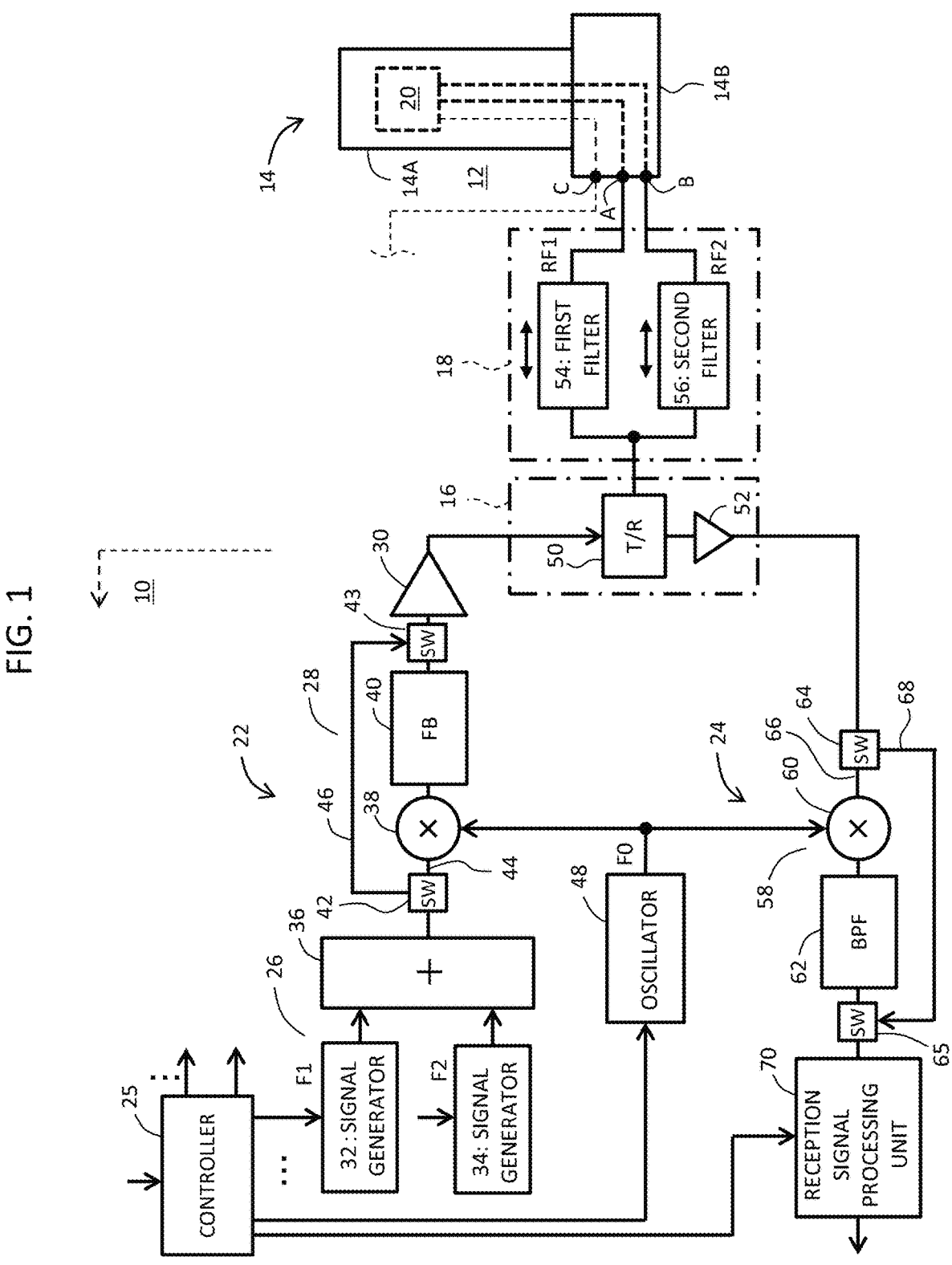
FIG. 1 is a block diagram showing an NMR measurement apparatus according to an embodiment of the present disclosure.

An NMR measurement apparatus according to an embodiment of the present disclosure comprises a mixer, a power amplifier, a demultiplexing circuit, and a controller. In the mixer, a transmission signal having a plurality of different frequency components is multiplied by a local signal. In this manner, a frequency-converted transmission signal is generated. In the power amplifier, the frequency-converted transmission signal is amplified, and an amplified transmission signal is output from the power amplifier. The demultiplexing circuit has a plurality of filters having a plurality of different frequency characteristics. In the demultiplexing circuit, the amplified transmission signal is allowed to pass through the plurality of filters, to generate, in parallel with each other, a plurality of transmission signals having a plurality of different irradiation frequencies. The plurality of transmission signals are output to an NMR detection circuit. The controller sets a condition for generating the plurality of different irradiation frequencies as a condition for frequency conversion by the mixer.

In the above-described configuration, the condition for the frequency conversion is set such that a plurality of transmission signals having a plurality of different irradiation frequencies are appropriately generated. With the condition set, the mixer frequency-converts the plurality of frequency components, and then, the power amplifier amplifies the plurality of frequency components after the frequency conversion. Then, the demultiplexing circuit extracts the plurality of frequency components after the amplification as a plurality of transmission signals, in parallel with each other. Thus, according to the above-described configuration, the plurality of transmission signals necessary for the NMR measurement can be generated by operating a simple structure under an appropriate condition. In particular, because a common constituent element (for example, a single mixer, or a single power amplifier) may be employed for the plurality of frequency components for generating the plurality of transmission signals, the device structure can be simplified.

The condition for the frequency conversion performed using the mixer may include a frequency of a local signal, a plurality of frequencies of the plurality of frequency components included in the transmission signal, a frequency conversion method, and the like. Alternatively, a condition which is determined in advance may be set in the transmission section by the controller, or a condition calculated by the controller may be set in the transmission section by the controller. When the plurality of transmission signals are sent to the NMR detection circuit, a sample is irradiated with a plurality of electromagnetic waves simultaneously or sequentially. Basically, the plurality of different irradiation frequencies of the plurality of transmission signals are determined based on an observation nucleus (an atomic nucleus to be observed), measurement objective, measurement conditions, and the like. The NMR detection circuit described above is a circuit having an electromagnetic wave irradiating function, and in this sense is an irradiation circuit and a detection circuit for NMR detection.

In an embodiment of the present disclosure, the plurality of transmission signals include a first transmission signal having a first irradiation frequency and a second transmission signal having a second irradiation frequency. The condition for frequency conversion includes a frequency of the local signal. The frequency of the local signal is a frequency calculated based on at least one of the first irradiation frequency or the second irradiation frequency.

The local signal is a common signal which is multiplied to the plurality of frequency components, and the frequency of the local signal directly defines the plurality of frequencies generated by the frequency conversion. Thus, the frequency of the local signal is one of important parameters in the frequency conversion. Such a parameter is calculated based on one or both of the first irradiation frequency and the second irradiation frequency.

In an embodiment of the present disclosure, one of the first irradiation frequency and the second irradiation frequency is a primary reference frequency. As a frequency conversion method, a difference method or a summation method to be described below is employed. The frequency of the local signal is a frequency calculated based on the primary reference frequency and the frequency conversion method.

As is well known, a difference frequency component (difference component) and a sum frequency component (sum component) appear at an output side of the mixer as results of multiplication of two frequencies which are input to the mixer. The difference method is a method in which the difference component is extracted and the sum component is removed, and the summation method is a method in which the sum component is extracted and the difference component is removed. The difference method and the summation method may be selectively employed, or one of the difference method and the summation method may be fixedly employed. In either case, in the calculation of the frequency of the local signal, the frequency conversion method is taken into consideration.

In the determination of the frequency of the local signal, if one of the first irradiation frequency and the second irradiation frequency is set as a basis, that is, if the primary reference frequency is set as the basis, the frequency of the local signal can be uniquely determined.

In an embodiment of the present disclosure, the plurality of different frequency components include a first frequency component having a first frequency and a second frequency component having a second frequency. The other of the first irradiation frequency and the second irradiation frequency (that is, the frequency which is not the primary reference frequency) is a sub reference frequency. The condition for the frequency conversion further includes the first frequency and the second frequency. At least one of the first frequency or the second frequency is a frequency calculated based on the sub reference frequency, the frequency of the local signal, and the frequency conversion method.

In an embodiment of the present disclosure, a frequency, among the first frequency and the second frequency, which corresponds to the primary reference frequency, is a designated frequency within a range of frequencies which can be generated. A frequency, among the first frequency and the second frequency, which corresponds to the sub reference frequency, is a calculated frequency within the range of frequencies which can be generated. The frequency of the local signal is a frequency calculated based on the primary reference frequency, the designated frequency, and the frequency conversion method. The calculated frequency is a frequency calculated based on the sub reference frequency, the frequency of the local signal, and the frequency conversion method.

When one of the first frequency and the second frequency is designated as the designated frequency, the frequency of the local signal can be calculated based on the designation. Then, the other of the first frequency and the second frequency is calculated as the calculated frequency. With such a stepwise frequency determination, the process for determining the condition for the frequency conversion can be simplified. In an embodiment of the present disclosure, the above-described frequency range coincides with a first range of frequencies which can be generated by a first frequency generator which generates the first frequency, and a second range of frequencies which can be generated by a second frequency generator which generates the second frequency. The designated frequency is a frequency which is determined first, and the calculated frequency is a frequency which is determined later.

When the frequency conversion method is the difference method and the designated frequency is a frequency exceeding ½ of the range of frequencies which can be generated, a lower frequency among the first irradiation frequency and the second irradiation frequency is desirably set as the primary reference frequency (lower frequency criterion). On the other hand, when the frequency conversion method is the difference method and the designated frequency is a frequency below ½ of the range of frequencies which can be generated, a higher frequency among the first irradiation frequency and the second irradiation frequency is desirably set as the primary reference frequency (higher frequency criterion). By employing the lower frequency criterion or the higher frequency criterion according to a combination of the difference method and highness/lowness of the designated frequency, it is possible to enlarge an acceptable frequency difference (difference between the first irradiation frequency and the second irradiation frequency). In other words, by determining a high designated frequency or a low designated frequency in the range of frequencies which can be generated, according to the combination of the difference method and a selected criterion (lower frequency criterion or higher frequency criterion), it is possible to enlarge the acceptable frequency difference.

When the frequency conversion method is the summation method and the designated frequency is a frequency below ½ of the range of frequencies which can be generated, a lower frequency among the first irradiation frequency and the second irradiation frequency is desirably set as the primary reference frequency (lower frequency criterion). On the other hand, when the frequency conversion method is the summation method and the designated frequency is a frequency exceeding ½ of the range of frequencies which can be generated, a higher frequency among the first irradiation frequency and the second irradiation frequency is desirably set as the primary reference frequency (higher frequency criterion). An acceptable frequency difference can be enlarged by employing the lower frequency criterion or the higher frequency criterion according to a combination of the summation method and highness/lowness of the designated frequency. In other words, by determining a high designated frequency or a low designated frequency in the range of frequencies which can be generated, according to the combination of the summation method and the selected criterion (lower frequency criterion or higher frequency criterion), it is possible to enlarge the acceptable frequency difference.

When the first irradiation frequency and the second irradiation frequency belong to a low frequency band, generally, the difference method is employed as the frequency conversion method. When the first irradiation frequency and the second irradiation frequency belong to a high frequency band, generally, the summation method is employed as the frequency conversion method. By keeping the frequency of the local signal low, advantages may be obtained such as that a degree of difficulty on the device design can be reduced, or that degradation of signal purity can be avoided. The low frequency band and the high frequency band are relative concepts, and the high frequency band is a frequency band higher than the low frequency band.

In an embodiment of the present disclosure, the difference method or the summation method is selected as the frequency conversion method, and the designated frequency is designated in such a manner that the calculated frequency is not a negative frequency and the calculated frequency does not exceed an upper limit of the frequency. The controller may select the difference method or the summation method. In this case, a frequency band to which the first frequency and the second frequency belong may be taken into consideration. The above-described frequency upper limit is an upper limit of the range of frequencies which can be generated.

In an embodiment of the present disclosure, the plurality of filters included in the demultiplexing circuit includes a first filter having a first frequency characteristic for generating the first transmission signal, and a second filter having a second frequency characteristic for generating the second transmission signal. The first frequency characteristic and the second frequency characteristic differ from each other. In general, the frequency characteristic may also be called a transmission band characteristic or a frequency band characteristic.

The NMR measurement apparatus according to an embodiment of the present disclosure further comprises a probe having the NMR detection circuit, a filter bank provided between the mixer and the power amplifier, and a bypassing path provided between the mixer and the power amplifier, and that bypasses the filter bank. When the demultiplexing circuit is to function between the power amplifier and the probe, the bypassing path functions. When the demultiplexing circuit is not to function between the power amplifier and the probe, the filter bank functions.

Each filter in the demultiplexing circuit may function as a difference component extractor or a sum component extractor. That is, each filter in the demultiplexing circuit may realize a function identical to each filter forming the filter bank. Thus, the difference component or the sum component can be appropriately extracted even when the transmission signal which is output from the mixer is sent to the demultiplexing circuit without passing through the filter bank. With this configuration, reduction of purity of the transmission signal can be prevented or reduced. Alternatively, a plurality of demultiplexing circuits may be prepared corresponding to a plurality of groups of irradiation frequencies, and a demultiplexing circuit suited to a selected group of irradiation frequencies may be selectively used. On the other hand, when suppression of unnecessary components to be removed is insufficient, or it is desired to suppress unnecessary components included in the signal which is input to the power amplifier, desirably, the filter bank and the demultiplexing circuit are caused to function simultaneously.

In an embodiment of the present disclosure, during reception, the demultiplexing circuit functions as a combining circuit. A combined reception signal is extracted from between the power amplifier and the demultiplexing circuit. For example, the combined reception signal is multiplied by a signal identical to the local signal used for the frequency conversion of the transmission signal, so that the combined reception signal is frequency-converted. Then, a signal processing for the frequency-converted combined reception signal is performed. When this configuration is employed, because it is not necessary to provide a plurality of preamplifiers and a plurality of reception frequency converters, the structure of the reception system can be simplified.

(2) Details of Embodiment

FIG. 1 shows an NMR measurement apparatus according to an embodiment of the present disclosure. The NMR measurement apparatus is one type of a sample analysis apparatus. Specifically, the NMR measurement apparatus is an apparatus which causes an NMR phenomenon to occur in a sample, and analyzes the sample by observing and analyzing an NMR signal caused by the NMR phenomenon. The NMR measurement apparatus according to the embodiment of the present disclosure has a function to simultaneously irradiate a plurality of electromagnetic waves having a plurality of different frequencies onto a sample.

In FIG. 1, the NMR measurement apparatus comprises a spectrometer 10, a static magnetic field generator 12, a probe 14, and the like, and further comprises a coupler 16 and a demultiplexing circuit 18. The demultiplexing circuit 18 is formed from, for example, a diplexer (which is also called a duplexer). The static magnetic field generator 12 has a superconductive magnet for generating a static magnetic field, a correction coil for correcting the static magnetic field, and the like. The probe 14 is formed from an insertion portion 14A and a base portion 14B. The insertion portion 14B is inserted into a bore of the correction coil, or the like. An NMR detection circuit 20 is provided in the insertion portion 14A.

The NMR detection circuit 20 is an electronic circuit for detecting the NMR signal, and has a function to irradiate an electromagnetic wave, in order to detect the NMR signal. The NMR detection circuit 20 has, for example, a transmission and reception coil and a transmission coil. The transmission and reception coil is, for example, a coil for irradiating an observation nucleus in the sample with an electromagnetic wave, and detecting the NMR signal generated in the observation nucleus. The transmission coil is, for example, a coil for irradiating an electromagnetic wave for decoupling between the observation nucleus and a peripheral nucleus. A plurality of transmission signals may be supplied to the plurality of coils, or a plurality of transmission signals may be supplied to one coil. The NMR detection circuit 20 also has an adjustment circuit (for example, a tuning circuit and a matching circuit). The NMR detection circuit 20 may be operated at room temperature or at a very low temperature.

The base portion 14B is a portion placed at an outer side of the bore. A plurality of ports A, B, and C are provided on the base portion 14B. In the illustrated example configuration, a first transmission signal is supplied to the port A, and a second transmission signal is supplied to the port B. The port A and the port B are connected to the NMR detection circuit 20 via two internal signal lines. Further, in the illustrated example configuration, the port C is also provided on the base portion 14B. Another transmission signal is supplied to the port C. In FIG. 1, illustration of a transmission section which generates the other transmission signal is omitted. In the embodiment of the present disclosure, the ports A and B are ports for a low frequency band, and the port C is a port for a high frequency band. Such an assignment of frequency bands is merely exemplary.

In FIG. 1, a frequency of a first electromagnetic wave (first irradiation frequency) is represented by RF1, and a frequency of a second electromagnetic wave (second irradiation frequency) is represented by RF2. For example, a combination of the irradiation frequencies, that is, RF1 and RF2, is determined according to the observation nucleus, the peripheral nucleus, the static magnetic field intensity, the measurement objective, the measurement conditions, and the like. A frequency of the first transmission signal is identical to the first irradiation frequency and is RF1, and a frequency of the second transmission signal is identical to the second irradiation frequency and is RF2. In the following, the frequency of the first transmission signal will be simply referred to as RF1 and the frequency of the second transmission signal will be simply referred to as RF2.

The spectrometer 10 comprises a controller 25, a transmission section 22, a reception section 24, an oscillator 48, and the like. The controller 25 is formed from, for example, a computer having a processor. The controller functions as a controlling unit or a controlling means. The controller 25 controls operations of various elements in the NMR measurement apparatus. The controller 25 of the embodiment of the present disclosure has a function to set a frequency conversion condition (more specifically, a set of frequencies (a frequency set) to be described below) for the transmission section 22. The controller 25 of the embodiment of the present disclosure also has a filter selection function, a routing control function, and the like. The controller 25 has a memory, or a memory is provided external to the controller 25. The memory stores conditions necessary for transmission and reception. The conditions include the frequency set. The controller 25 controls transmission and reception based on the information stored in the memory.

The transmission section 22 has a signal generation unit 26, a combiner 36, a frequency converter 28, and a power amplifier 30. In the illustrated example configuration, the signal generation unit 26 has a first signal generator 32 and a second signal generator 34. A frequency of a first original transmission signal (first frequency) generated by the first signal generator 32 is represented by F1. A frequency of a second original transmission signal (second frequency) generated by the second transmission generator 34 is represented by F2. In the following, the first frequency will simply be referred to as F1 and the second frequency will simply be referred to as F2. From the viewpoint of frequency conversion to be described below, each of F1 and F2 may also be called an intermediate frequency (IF). F1 and F2 are set by the controller 25.

When a range of frequencies which can be generated by the first signal generator 32 is expressed as a first frequency range, and a range of frequencies which can be generated by the second signal generator 34 is expressed as a second frequency range, in the embodiment of the present disclosure, the first frequency range and the second frequency range are identical to each other. In the following, the first frequency range and the second frequency range will simply be referred to as a frequency range. As will be described later in detail, in the embodiment of the present disclosure, one of F1 and F2 is a designated frequency designated within the frequency range, and the other of F1 and F2 is a calculated frequency which is calculated within the frequency range. In the process of determining an apparatus operation condition, the designated frequency is a frequency which is determined first, and the calculated frequency is a frequency which is determined later.

The combiner 36 combines the first original transmission signal and the second original transmission signal, to generate a combined original transmission signal. The combined original transmission signal is a single transmission signal including a first frequency component having F1 and a second frequency component having F2.

The frequency converter 28 has a mixer 38, a filter bank (FB) 40, a switch 42, a switch 43, and the like. With the switches 42 and 43, one of a mixing path 44 and a bypassing path 46 is selected. The mixer 38 is a multiplier for frequency conversion. That is, the combined original transmission signal and a local signal are multiplied in the mixer 38. With this process, a difference component and a sum component are generated at an output side of the mixer 38.

In the embodiment of the present disclosure, a difference method is employed as the frequency conversion method. In the difference method, the difference component is used among the difference component and the sum component generated as a result of the multiplication. Specifically, a filter in the filter bank 40 is selected such that the difference component is extracted and the sum component is removed. A transmission signal after frequency conversion, which is output from the mixer, is sent to the selected filter. Each filter in the filter bank 40 is formed from, for example, an LPF (Low Pass Filter) or a BPF (Band Pass Filter).

Alternatively, a summation method may be employed as the frequency conversion method. In this case, a filter in the filter bank 40 is selected such that the sum component is extracted and the difference component is removed. In this case, each filter in the filter bank 40 is formed from, for example, an HPF (High Pass Filter) or the BPF. Alternatively, the difference method or the summation method may be selected by the controller 25 according to RF1 and RF2.

The transmission signal after the frequency conversion is sent to the power amplifier 30. The power amplifier 30 is an electronic circuit which amplifies the transmission signal. In the embodiment of the present disclosure, a single frequency converter 28 and a single power amplifier 30 are provided in the transmission section 22, and the structure of the transmission section 22 is thus simplified. Various power amplification devices may be used as the power amplifier 30. Alternatively, the power amplifier 30 may be formed from a plurality of amplifier circuits.

The frequency converter 28 in the embodiment of the present disclosure includes the bypassing path 46. When the frequency conversion is not necessary, the bypassing path 46 is selected by the switches 42 and 43. In this case, the transmission signal is sent to the power amplifier 30 via the bypassing path 46.

The oscillator 48 generates a local signal having a frequency F0. That is, the oscillator 48 is a local oscillator. The local signal is a signal for the frequency conversion. The frequency F0 of the local signal is set by the controller 25. The local signal is supplied to both the transmission section 22 and the reception section 24. Alternatively, a phase adjuster may be provided on a supply path of the local signal as necessary. In the following, the frequency of the local signal will simply be referred to as F0.

The coupler 16 is also called a head amplifier chassis. In the coupler 16, a T/R switch (transmission/reception path selection switch) 50 and a preamplifier 52 are provided. The preamplifier 52 is a circuit which amplifies a weak NMR signal which is output from the NMR detection circuit 20. The T/R switch 50 is a circuit for supplying the transmission signal which is output from the power amplifier 30 to the demultiplexing circuit 18, and for sending the reception signal which is output from the demultiplexing circuit 18 to the preamplifier 52. That is, the T/R switch 50 is an electronic circuit for switching the transmission/reception path. The T/R switch 50 may be formed from a directional coupler or the like. The demultiplexing circuit 18 functions as a combining circuit (multiplexing circuit) during reception, as will be described below.

The demultiplexing circuit 18 has a first filter 54 and a second filter 56 which are provided in parallel with each other. The first filter 54 has a first frequency characteristic, and the second filter 56 has a second frequency characteristic. The first frequency characteristic and the second frequency characteristic differ from each other. The frequency characteristic may also be called a frequency band characteristic. A frequency component having RF1 (that is, the first transmission signal) is extracted by the first filter 54, and other frequency components are suppressed. A frequency component having RF2 (that is, the second transmission signal) is extracted by the second filter 56, and the other frequency components are suppressed. RF1 and RF2 differ from each other. In this manner, the demultiplexing circuit 18 generates the first transmission signal and the second transmission signal in parallel with each other, and outputs the first transmission signal and the second transmission signal in parallel with each other. The demultiplexing circuit 18 is specifically a diplexer.

During transmission, the first transmission signal which is output from the demultiplexing circuit 18 is sent to the NMR detection circuit 20 via the port A, and the second transmission signal which is output from the demultiplexing circuit 18 is sent to the NMR detection circuit 20 via the port B. The first electromagnetic wave and the second electromagnetic waves are irradiated onto the sample by the NMR detection circuit 20.

During reception, the demultiplexing circuit 18 functions as a combining circuit. More specifically, a first reception signal appears at an output side (a side of the T/R switch) of the demultiplexing circuit 18 via the port A and the first filter 54. In addition, a second reception signal appears at the output side of the demultiplexing circuit 18 via the port B and the second filter 56. At the output side of the demultiplexing circuit 18, a combined reception signal is generated, which is formed from the first reception signal and the second reception signal. The combined reception signal is sent to the reception section 24 via the T/R switch 50 and the preamplifier 52. Normally, one reception signal among the first reception signal and the second reception signal forming the combined reception signal is set as a processing target. Alternatively, both of the first and second reception signals may be set as the processing target.

In the embodiment of the present disclosure, the demultiplexing circuit 18 can be inserted or removed. Each of the first filter 54 and the second filter 56 may be formed from a plurality of filter elements. As will be described below, three or more filters may be provided in the demultiplexing circuit 18. Alternatively, the demultiplexing circuit 18 may be provided in the coupler 16, or in the probe 14. In a state in which the demultiplexing circuit 18 is removed, a typical NMR measurement apparatus is formed in which a single frequency signal is transmitted and received at each transmission and reception channel. In a state where the demultiplexing circuit 18 is inserted, a special NMR measurement apparatus is formed in which a plurality of transmission/reception signals are transmitted and received at a single transmission and reception channel. The use/non-use of the demultiplexing circuit 18, and a type of the NMR probe, are selected according to a nucleus species of the nucleus to be measured, or the like.

The reception section 24 has a frequency converter 58 and a reception signal processing unit 70. The frequency converter 58 has a mixer 60, a bandpass filter 62, a switch 64, a switch 65, and the like. In the mixer 60, the combined reception signal is multiplied by a signal which is identical to the local signal supplied to the mixer 38. Of a difference component and a sum component generated by the multiplication, the difference component is extracted by the bandpass filter 62. The bandpass filter 62 has a role of passing an observation frequency component after the frequency conversion and removing other frequency components. Alternatively, as the bandpass filter 62, a filter in which the pass band can be varied may be provided.

The switches 64 and 65 are switches for selecting one of a mixing path 66 and a bypassing path 68. When the frequency conversion is to be performed, the mixing path 66 is selected, and, when the frequency conversion is not to be performed, the bypassing path 68 is selected. The reception signal processing unit 70 has an A/D converter, a quadrature detection circuit, and the like. Alternatively, frequency analysis of the reception signal may be performed in the reception signal processing unit 70, to generate the NMR spectrum.

With the embodiment shown in FIG. 1, it is not necessary to provide a plurality of frequency converters and a plurality of power amplifiers for the generation of the first transmission signal and the second transmission signal. That is, the first transmission signal and the second transmission signal can be generated using a single frequency converter and a single power amplifier. Therefore, the structure of the transmission section can be simplified. In addition, it is not necessary to provide a plurality of frequency converters and a plurality of preamplifiers for detection of the first reception signal and the second reception signal. That is, the first reception signal and the second reception signal can be detected using a single frequency converter and a single preamplifier. Thus, the structure of the reception section can be simplified.

Because the demultiplexing circuit 18 is a relatively inexpensive component, in the embodiment of the present disclosure, by the simplification of the structures of the transmission section and the reception section, significant cost reduction can be achieved. In the processing of the reception signal, a state in which the phase is synchronized between the transmission signal and the reception signal must be maintained. When a plurality of reception sections are provided in parallel with each other, desirably, the performances of the plurality of reception sections are matched to the maximum possible degree. However, in reality, it is not easy to completely satisfy this need. When the plurality of reception sections are provided in parallel with each other, a problem of reduction in processing precision due to differences in performance tends to easily occur. On the contrary, in the structure of the embodiment of the present disclosure, such a problem does not occur.

In the structure of the embodiment of the present disclosure, F0, F1, and F2, that is, the "frequency set", must be appropriately determined according to the employed frequency conversion method so that RF1 and RF2 are appropriately generated. Conditions for the frequency conversion will now be described in detail.

When the difference method is employed as the frequency conversion method, in the frequency conversion, conditions that F0−F1=RF1 and F0−F2=RF2 must be satisfied. On the other hand, when the summation method is employed as the frequency conversion method, in the frequency conversion, conditions that F0+F1=RF1 and F0+F2=RF2 must be satisfied.

As already described, F1 and F2 are frequencies that are designated or calculated within the frequency range. One of F1 and F2 is the designated frequency, and the other of F1 and F2 is the calculated frequency. The frequency range is, for example, 200 MHz. A lower limit of the frequency range is, for example, 0 MHz or 1 MHz, and an upper limit of the frequency range is 200 MHz. Based on these values, a relatively high frequency such as 125 MHz, 150 MHz, 175 MHz, or the like is set as the designated frequency, or a relatively low frequency such as 25 MHz, 50 MHz, 75 MHz, or the like is set as the designated frequency.

When the method is the difference method, and the designated frequency exceeds ½ of the frequency range (an average between an upper limit and a lower limit of the frequency range), that is, in the case of a high frequency designation, a lower RF among RF1 and RF2 is set as the primary reference frequency, and a higher RF among RF1 and RF2 is set as the sub reference frequency. In short, in the case of the combination of the difference method and the high frequency designation (hereinafter referred to as a "first combination"), the lower frequency criterion is employed. On the other hand, when the method is the difference method, and the designated frequency is below ½ of the frequency range, that is, in the case of a low frequency designation, a higher RF among RF1 and RF2 is set as the primary reference frequency, and a lower RF among RF1 and RF2 is set as the sub reference frequency. In short, in the case of the combination of the difference method and the low frequency designation (hereinafter referred to as a "second combination"), the higher frequency criterion is employed.

When the method is the summation method, and the designated frequency is below ½ of the frequency range, that is, in the case of the low frequency designation, a lower RF among RF1 and RF2 is set as the primary reference frequency, and a higher RF among RF1 and RF2 is set as the sub reference frequency. In short, in the case of the combination of the summation method and the low frequency designation (hereinafter referred to as a "third combination"), the lower frequency criterion is employed. On the other hand, when the method is the summation method, and the designated frequency exceeds ½ of the frequency range, that is, in the case of the high frequency designation, a higher RF among RF1 and RF2 is set as the primary reference frequency, and a lower RF among RF1 and RF2 is set as the sub reference frequency. In short, in the case of the combination of the summation method and the low frequency designation (hereinafter referred to as a "fourth combination"), the higher frequency criterion is employed.

By determining the frequency set according to the requirements as described above, the acceptable frequency difference (difference between RF1 and RF2) can be enlarged, as will be described below with reference to FIGS. 7 and 8. In other words, frequency generation corresponding to a larger number of nucleus species can be enabled. In the embodiment of the present disclosure, the first combination is employed, but other combinations may be selectively employed according to the situations.

In any of the combinations, first, the frequency F0 of the local signal is calculated based on the primary reference frequency (RF1 or RF2) and the designated frequency FS (=F1 or F2). Then, the calculated frequency (F2 or F1) is calculated based on the sub reference frequency (RF2 or RF1) and F0. Through the stepwise process as described, the frequency set (F0, F1, F2) is specified.

In the above description, RF1 and F1 are fixedly correlated to each other, and RF2 and F2 are fixedly correlated to each other. Alternatively, other correlation relationships may be employed as the relationship between RF1 and RF2, and F1 and F2. For example, a lower RF among RF1 and RF2 may be assigned to F1, and a higher RF among RF1 and RF2 may be assigned to F2.

FIG. 2 exemplifies four frequency sets, that is, four frequency sets corresponding to the first combination (#1), the second combination (#2), the third combination (#3), and the fourth combination (#4). In FIG. 2, among RF1 and RF2, a frequency in a cell which is shown in gray is the primary reference frequency. Among F1 and F2, a frequency in a cell which is shown in gray is the designated frequency. The frequency range FR is 0~200 MHz. The numerical values described in the present disclosure, however, are merely exemplary.

With reference to the frequency set corresponding to the first combination (#1), RF1 is 60 MHz, and RF2 is 150 MHz. The designated frequency is 125 MHz. With the difference method, RF1 which is the lower RF is set as the primary reference frequency, and 125 MHz which is the designated frequency is assigned to F1 corresponding to RF1. As a result, F0 is calculated as 185 MHz, and F2 is calculated as 35 MHz.

With reference to the frequency set corresponding to the second combination (#2), similar to the above, RF1 is 60 MHz, and RF2 is 150 MHz. The designated frequency is 25 MHz. With the difference method, RF2 which is the higher RF is set as the primary reference frequency, and 25 MHz which is the designated frequency is assigned to F2 corresponding to RF2. As a result, F0 is calculated as 175 MHz, and F1 is calculated as 115 MHz.

With reference to the frequency set corresponding to the third combination (#3), RF1 is 560 MHz, and RF2 is 600 MHz. The designated frequency is 25 MHz. With the summation method, RF1 which is the lower RF is set as the primary reference frequency, and 25 MHz which is the designated frequency is assigned to F1 corresponding to RF1. As a result, F0 is calculated as 535 MHz, and F2 is calculated as 65 MHz.

With reference to the frequency set corresponding to the fourth combination (#4), similar to the above, RF1 is 560 MHz, and RF2 is 600 MHz. The designated frequency is 125 MHz. With the summation method, RF2 which is the higher RF is set as the primary reference frequency, and 125 MHz which is the designated frequency is assigned to F2 corresponding to RF2. As a result, F0 is calculated as 475 MHz, and F1 is calculated as 85 MHz.

In the embodiment of the present disclosure, the first combination is employed, but alternatively, the combination to be used may be selected from among the four combinations. In the embodiment of the present disclosure, the designated frequency is fixed regardless of the combination of RF1 and RF2. Alternatively, the designated frequency may be varied according to the combination of RF1 and RF2.

Figure 3:
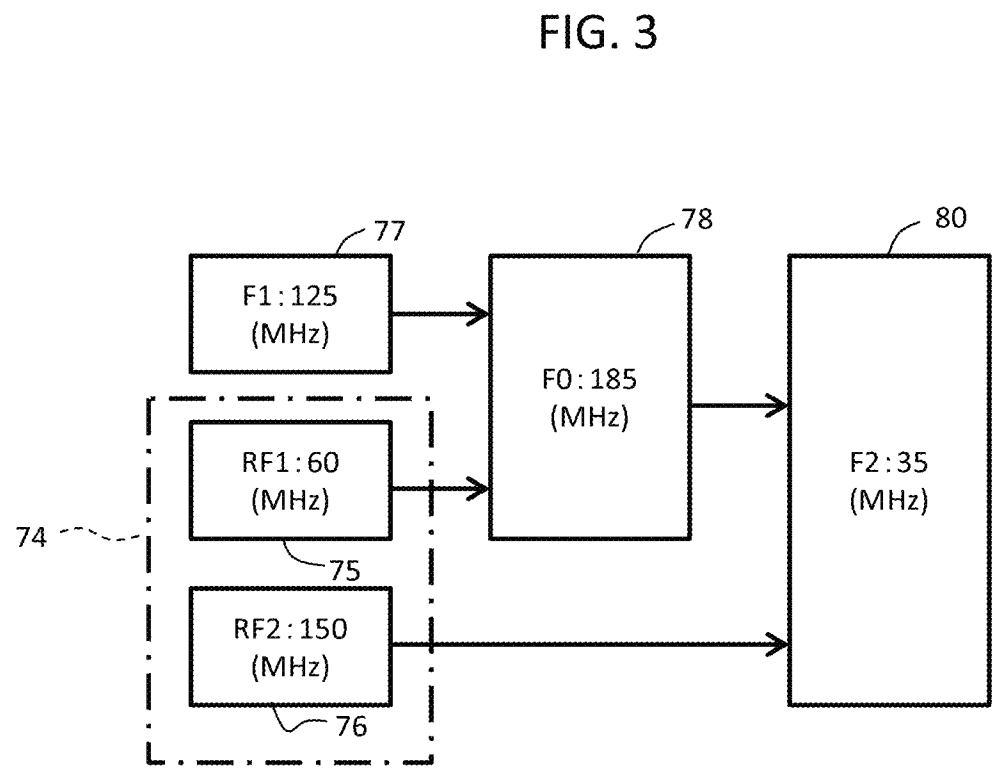

FIG. 3 schematically shows an example method of calculating the frequency set in the first combination. In FIG. 3, reference numeral 74 shows a combination of RF1 and RF2. RF1 is 60 MHz as shown by reference numeral 75, and RF2 is 150 MHz as shown by reference numeral 76. A frequency which is relatively low, that is, RF1, is set as the primary reference frequency, and a frequency which is relatively high, that is, RF2, is set as the sub reference frequency. As shown by reference numeral 77, F1 is the designated frequency FS. That is, F1 is 125 MHz.

First, as shown by reference numeral 78, F0 is calculated based on F1 and RF1. Specifically, F0 is calculated by F0=F1+RF1, as 185 MHz. Then, as shown by reference numeral 80, F2 is calculated based on RF2 and F0. Specifically, F2 is calculated by F2=F0-RF2, as 35 MHz.

Figure 4:
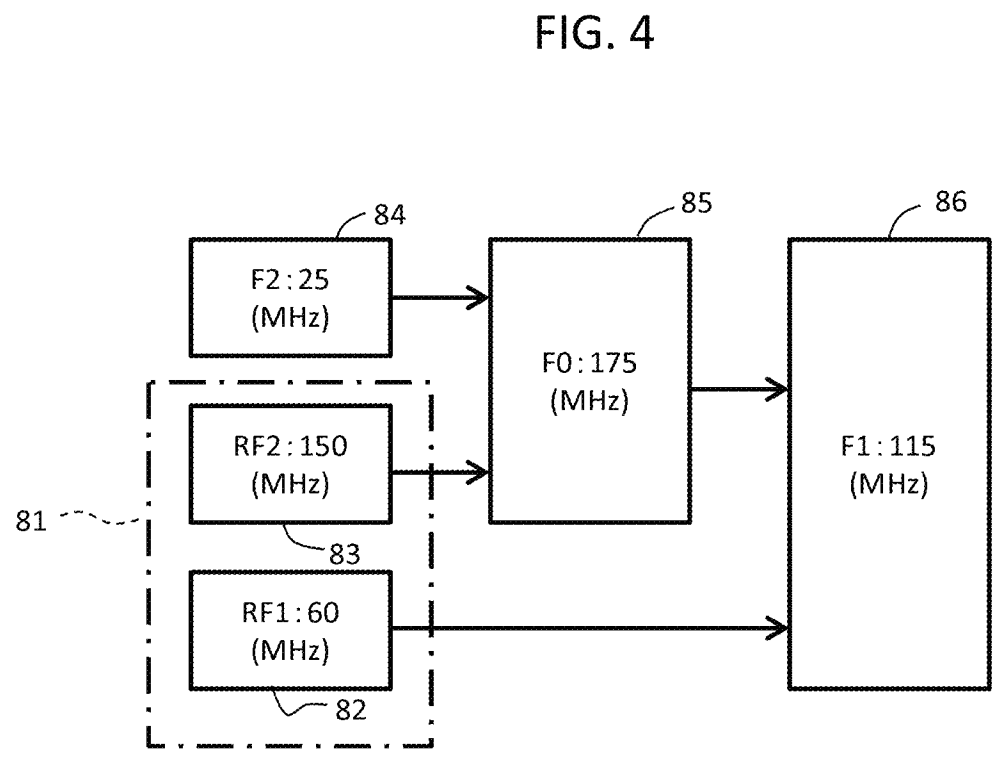

FIG. 4 schematically shows an example method of calculating the frequency set in the second combination. In FIG. 4, reference numeral 81 shows a combination of RF1 and RF2. RF1 is 60 MHz as shown by reference numeral 82, and RF2 is 150 MHz as shown by reference numeral 83. A frequency which is relatively high, that is, RF2, is set as the primary reference frequency, and a frequency which is relatively low, that is, RF1, is set as the sub reference frequency. As shown by reference numeral 84, F2 is the designated frequency FS. That is, F2 is 25 MHz.

First, as shown by reference numeral 85, F0 is calculated based on F2 and RF2. Specifically, F0 is calculated by F0=F2+RF2, as 175 MHz. Then, as shown by reference numeral 86, F1 is calculated based on RF1 and F0. Specifically, F1 is calculated by F1=F0-RF1, as 115 MHz.

As described, with the difference method, the designated frequency which is fixedly determined is prepared, and the stepwise calculation is performed. With this process, it is possible to quickly and easily specify or calculate the frequency set suited to the combination of RF1 and RF2.

Figure 5:
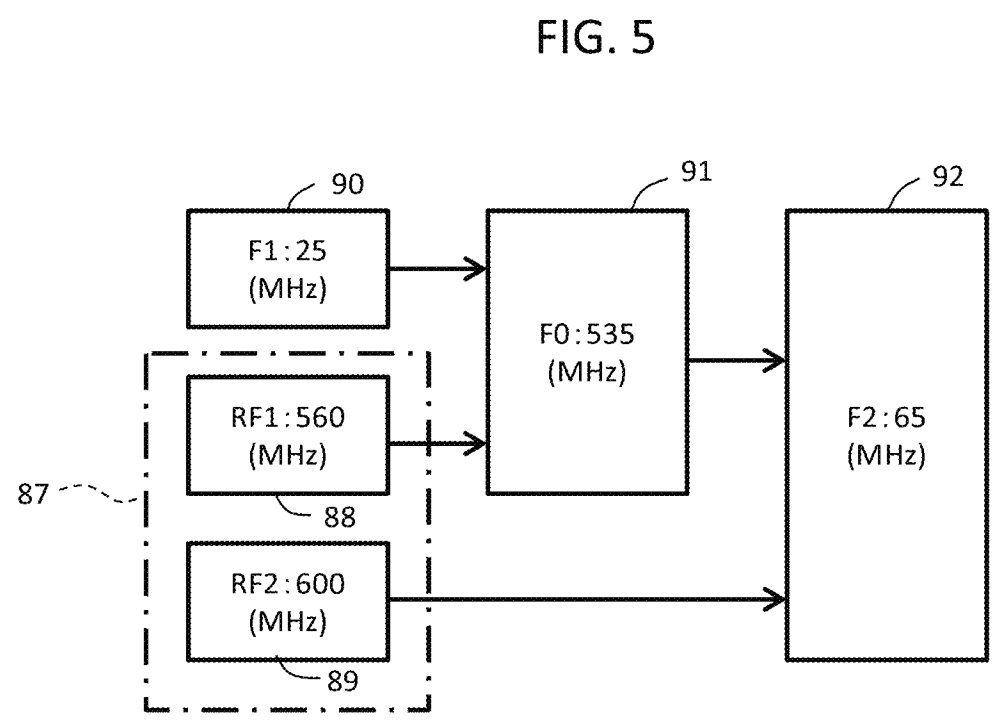

FIG. 5 schematically shows an example method of calculating the frequency set in the third combination. In FIG. 5, reference numeral 87 shows a combination of RF1 and RF2. RF1 is 560 MHz as shown by reference numeral 88, and RF2 is 600 MHz as shown by reference numeral 89. A frequency which is relatively low, that is, RF1, is set as the primary reference frequency, and a frequency which is relatively high, that is, RF2, is set as the sub reference frequency. As shown by reference numeral 90, F1 is the designated frequency FS. That is, F1 is 25 MHz.

First, as shown by reference numeral 91, F0 is calculated based on F1 and RF1. Specifically, F0 is calculated by F0=RF1−F1, as 535 MHz. Then, as shown by reference numeral 92, F2 is calculated based on RF2 and F0. Specifically, F2 is calculated by F2=RF2-F0, as 65 MHz.

Figure 6:
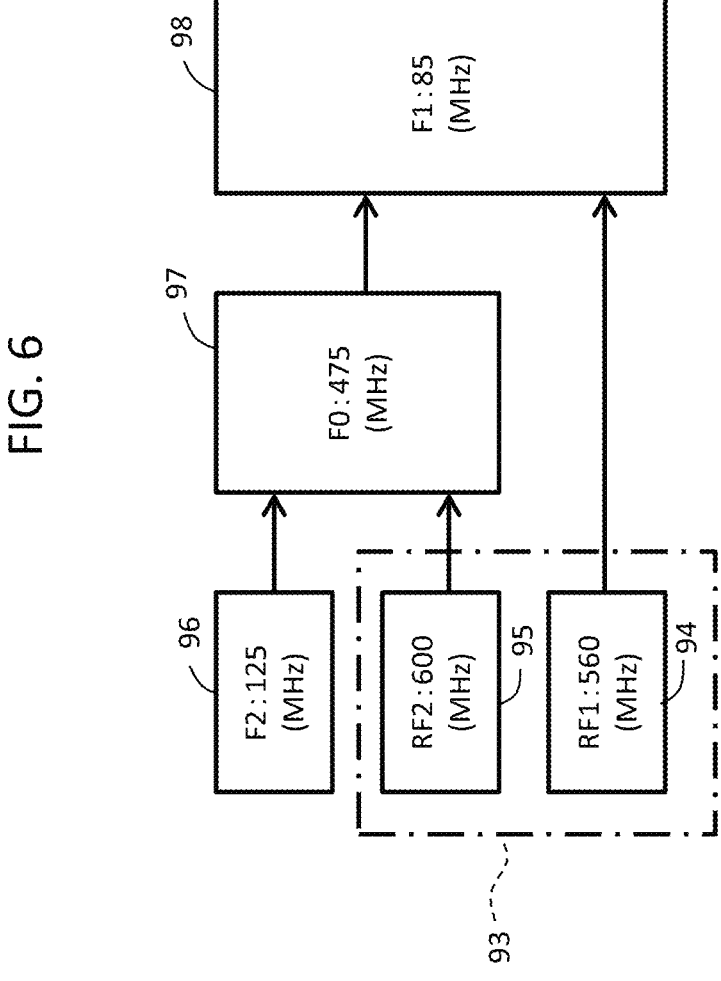
FIG. 6 is a diagram showing an example calculation of a frequency set in a fourth combination.

FIG. 6 schematically shows an example method of calculating the frequency set in the fourth combination. In FIG. 6, reference numeral 93 shows a combination of RF1 and RF2. RF1 is 560 MHz as shown by reference numeral 94, and RF2 is 600 MHz as shown by reference numeral 95. A frequency which is relatively high, that is, RF2, is set as the primary reference frequency, and a frequency which is relatively low, that is, RF1, is set as the sub reference frequency. As shown by reference numeral 96, F2 is the designated frequency FS. That is, F2 is 125 MHz.

First, as shown by reference numeral 97, F0 is calculated based on F2 and RF2. Specifically, F0 is calculated by F0=RF2−F2, as 475 MHz. Then, as shown by reference numeral 98, F1 is calculated based on RF1 and F0. Specifically, F1 is calculated by F1=RF1−F0, as 85 MHz.

As described, even when the summation method is employed, the designated frequency which is fixedly determined is used, and the stepwise calculation is performed. With this process, it is possible to quickly and easily specify or calculate the frequency set suited to the combination of RF1 and RF2.

In the first combination, as a case in which an inappropriate setting value is calculated, for example, the following case may be exemplified. A case which is opposite to the above description will be considered. Namely, a frequency which is relatively high, that is, RF2, is set as the primary reference frequency, and a frequency which is relatively low, that is, RF1, is set as the sub reference frequency. F2 is the designated frequency FS, and thus is 125 MHz. F0 is calculated based on F2 and RF2. Specifically, F0 is calculated by F0=F2+RF2, as 275 MHz. Then, F1 is calculated based on RF1 and F0. Specifically, F1 is calculated by F1=F0-RF1, as 205 MHz. This frequency exceeds FR, and is inappropriate.

Figure 7:
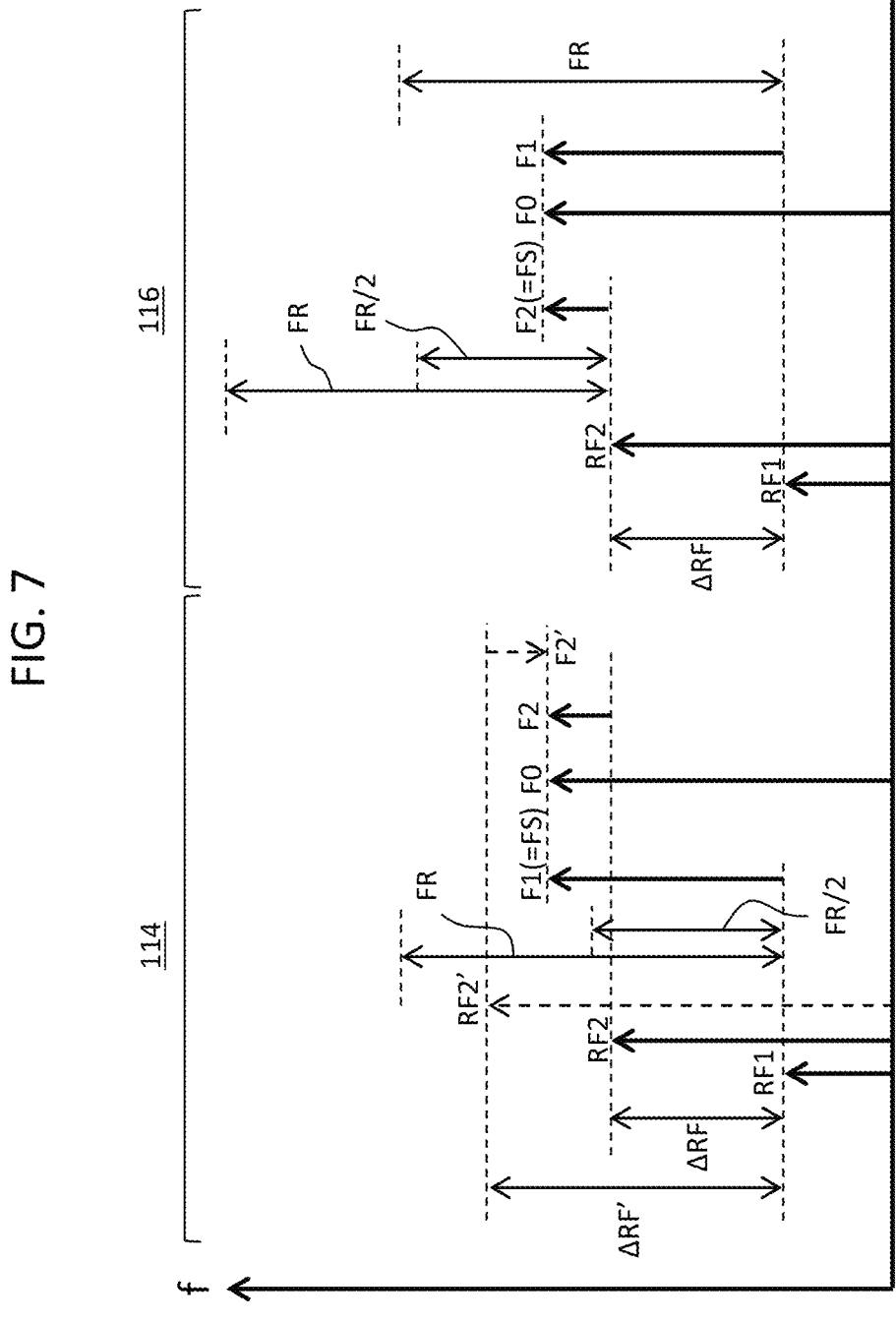
FIG. 7 is a diagram showing a method of determining a frequency set when a difference method is employed.

FIG. 7 diagrammatically shows the calculation of the frequency set with the difference method, more specifically, the calculation of the frequency sets in the first combination and the second combination. The difference method is generally employed when RF1 and RF2 belong to the low frequency band. Reference numeral 114 shows the first combination, and reference numeral 116 shows the second combination. The vertical axis shows the frequency.

In both the first combination and the second combination which are illustrated, the condition of RF1<RF2 is satisfied. In the first combination, the designated frequency FS is a high frequency exceeding ½ of the frequency range FR. In the second combination, the designated frequency FS is a low frequency below ½ of the frequency range FR. Needless to say, the designated frequency FS is a frequency which is lower than or equal to the upper limit value of the frequency range FR.

In the first combination, the lower RF, RF1, is set as the primary reference frequency, that is, the criterion frequency. F0 is calculated by adding F1 (=FS) to RF1. Then, F2 is calculated by subtracting RF2 from F0. In the illustrated example configuration, F2 is a positive frequency. A difference between RF1 and RF2 is shown by ΔRF.

For example, when RF2 becomes RF2', ΔRF' becomes large. When ΔRF' exceeds F1 (=FS), F2' to be calculated becomes a negative frequency in the numerical value calculation. In order to avoid such a situation, desirably, a largest possible value is given to FS. For example, the upper limit value of the frequency range FR may be given to FS. When a large value is given to FS, the difference between the summation component and the difference component which are output from the mixer becomes large, that is, the frequency difference between the necessary signal and the unnecessary signal becomes large. Thus, it becomes easier to remove the unnecessary signal. That is, by giving a large value for FS, the filter design can be facilitated.

In the second combination, a higher RF, that is, RF2, is set as the primary reference frequency, that is, the criterion frequency. F0 is calculated by adding F2 (=FS) to RF2. Then, F1 is calculated by subtracting RF1 from F0. A difference between RF1 and RF2 is shown by ΔRF. In order to enlarge ΔRF, desirably, FS is as small as possible. A minimum value (lower limit value) in the frequency range FR may be given to FS. When a small value is given to FS, advantages may be obtained in that it becomes not necessary to use a high-performance device, in that the signal purity is not significantly reduced, and the like.

Figure 8:
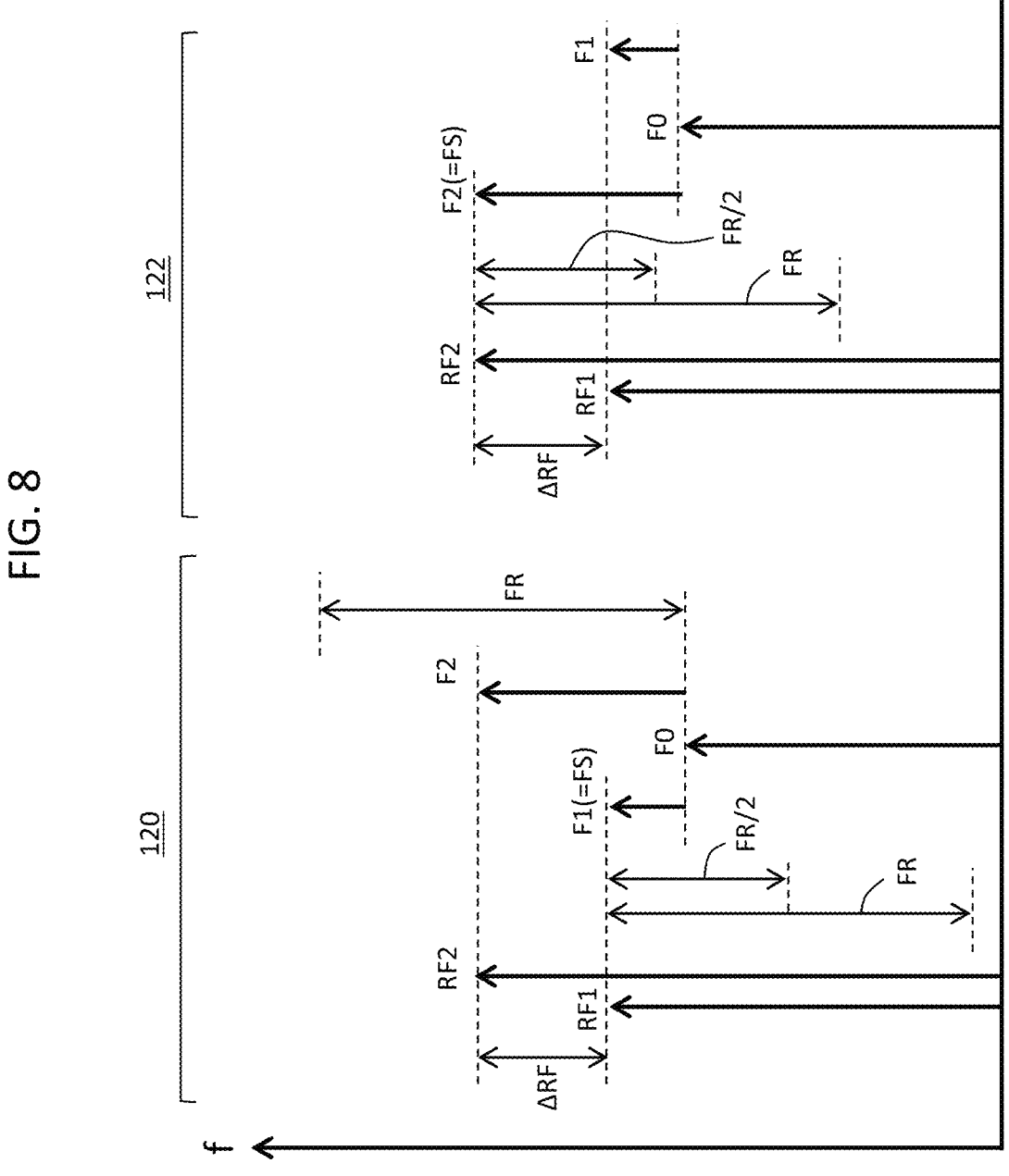
FIG. 8 is a diagram showing a method of determining a frequency set when a summation method is employed.

FIG. 8 diagrammatically shows the calculation of the frequency set with the summation method, more specifically, the calculation of the frequency sets in the third combination and in the fourth combination. The summation method is generally employed when RF1 and RF2 belong to a high frequency band. Reference numeral 120 shows the third combination, and reference numeral 122 shows the fourth combination. The vertical axis shows the frequency.

In both the third combination and the fourth combination which are illustrated, the condition of RF1<RF2 is satisfied. In the third combination, the designated frequency FS is a low frequency below ½ of the frequency range FR. In the fourth combination, the designated frequency FS is a high frequency exceeding ½ of the frequency range FR.

In the third combination, RF1 which is the lower RF among RF1 and RF2 is set as the primary reference frequency. F0 is calculated by subtracting F1 (=FS) from RF1. F2 is calculate by subtracting F0 from RF2. Needless to say, F2 must be within the frequency range FR. In the third combination, in order to enlarge the acceptable ΔRF, FS is desirably small, and FS may be matched with the lower limit value of FR. When FS is small, it is possible to obtain advantages similar to the advantages which can be obtained when FS is set to a small value in the second combination.

In the fourth combination, RF2 which is the higher RF among RF1 and RF2 is set as the primary reference frequency. F0 is calculated by subtracting F2 (=FS) from RF2. Then, F1 is calculated by subtracting F0 from RF1. In the fourth combination, in order to enlarge the acceptable ΔRF, FS is desirably large, and FS may be matched with the upper limit value of FR. When FS is large, it is possible to obtain advantages similar to the advantages which can be obtained when FS is set to a large value in the first combination.

The illustrations in FIGS. 7 and 8 are merely exemplary. The frequency conversion method, the criterion RF, the designated frequency, and the like may be selected according to the specific frequency relationship. Alternatively, the designated frequency may be variable. For example, the designated frequency may be adaptively determined based on ΔRF.

Figure 9:
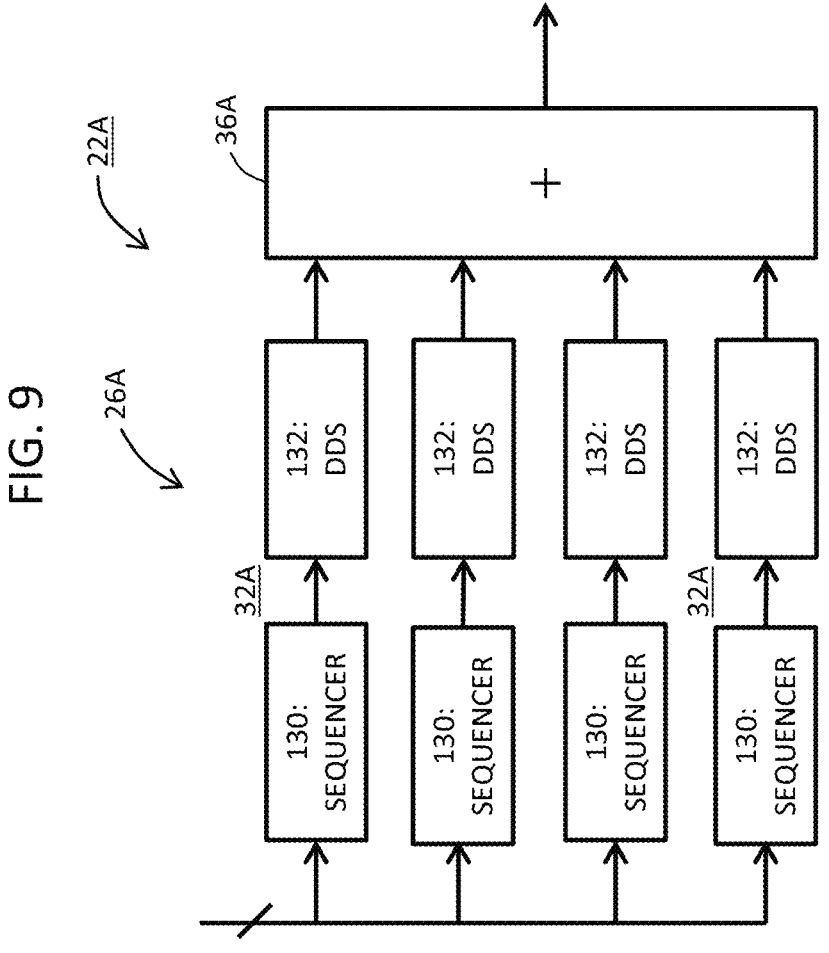
FIG. 9 is a diagram showing an alternative configuration of a transmission unit.

FIG. 9 shows an alternative configuration of the transmission section. FIG. 9 shows a part of a transmission section 22A. The transmission section 22A has a signal generation unit 26A and a combiner 36A. The signal generation unit 26A is formed from a plurality of signal generators 32A. Each signal generator 32A is formed from a sequencer 130 and a DDS (Direct Digital Synthesizer) 132. The sequencer 130 generates a desired pulse sequence or a corresponding command sequence, and the DDS 132 generates the original transmission signal according to the pulse sequence or command sequence. The DDS 132 has a function to generate various waveforms. In the combiner 36A, a plurality of original transmission signals are combined. The combined original transmission signal after being combined is sent to the frequency converter (not shown).

Figure 10:
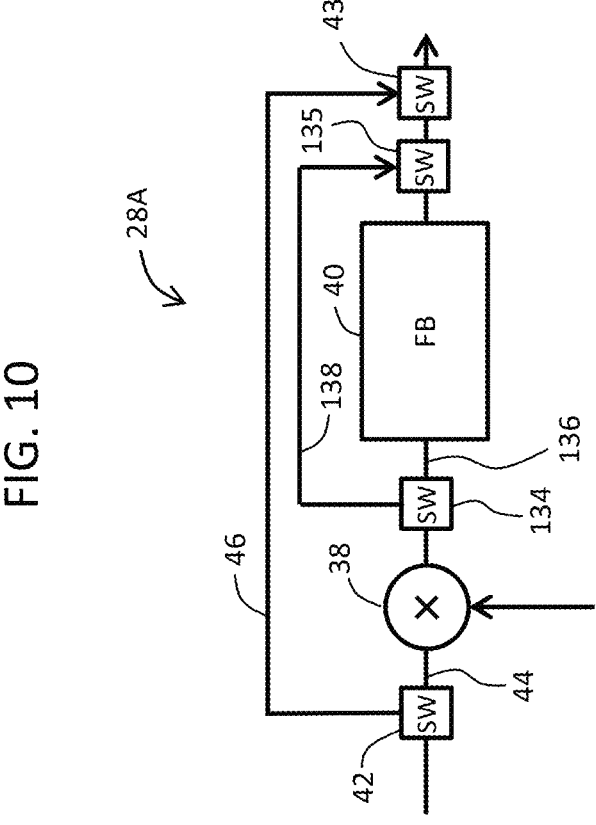
FIG. 10 is a diagram showing an alternative configuration of a frequency converter.

FIG. 10 shows an alternative configuration of the frequency converter. In FIG. 10, elements similar to the elements shown in FIG. 1 are assigned the same reference numerals, and descriptions thereof will be omitted.

A plurality of filters in the demultiplexing circuit may realize a function similar to the function of the filter bank 40. That is, the plurality of filters in the demultiplexing circuit may also function as a difference component extractor or a sum component extractor. Presuming this configuration, a bypassing path 138 may be selected by switches 134 and 135, so that the purity of the transmission signal can be maintained. When it is desired to send the transmission signal to the filter bank 40, a filtering path 136 may be selected through switches 134 and 135.

FIG. 11 shows specific examples of the structure of the demultiplexing circuit. A combination of two BPFs identified by TYPE 1 has a frequency characteristic shown by reference numeral 140-1. A combination of an HPF and an LPF identified by TYPE 2 has a frequency characteristic shown by reference numeral 140-2. A combination of a BPF and an LPF identified by TYPE 3 has a frequency characteristic shown by reference numeral 140-3. A combination of an HPF and a BPF identified by TYPE 4 has a frequency characteristic shown by reference numeral 140-4. A combination of 2 BRFs (Band Rejection Filters) identified by TYPE k has a frequency characteristic shown by reference numeral 140-k. A BRF is also called a BEF (Band Elimination Filter).

Figure 12:
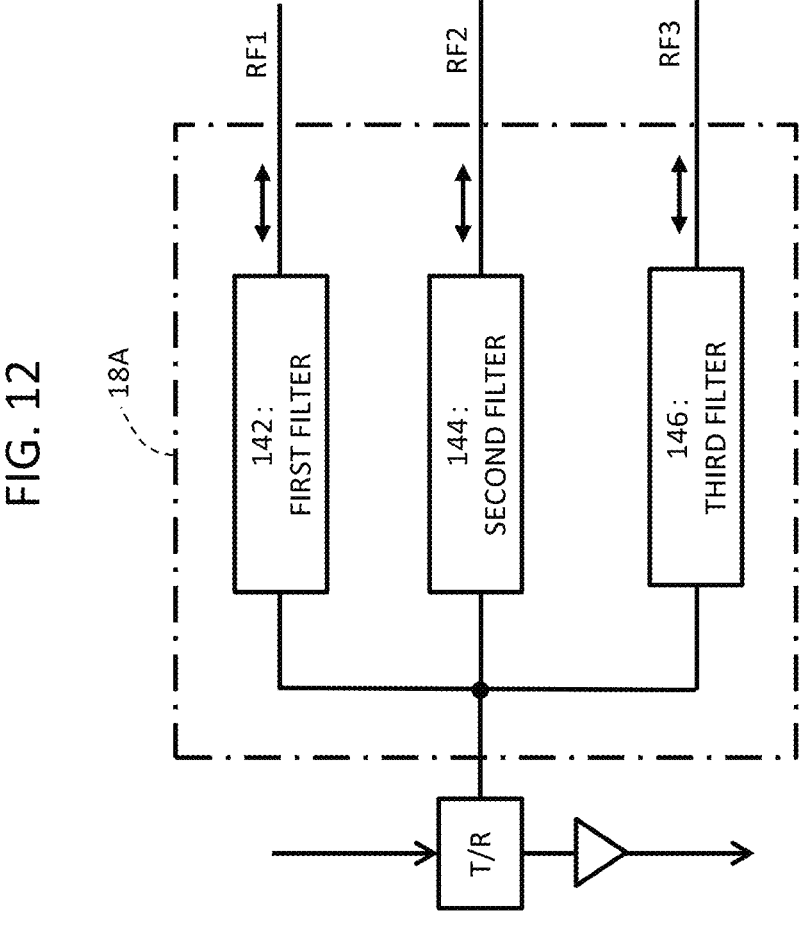
FIG. 12 is a diagram showing an alternative configuration of a demultiplexing circuit (combining circuit).

FIG. 12 shows an alternative configuration of the demultiplexing circuit. A demultiplexing circuit 18A has a first filter 142, a second filter 144, and a third filter 146, which are placed in parallel with each other. The demultiplexing circuit 18A may also be called a triplexer. A transmission signal having a frequency of RF1 is generated by the first filter 142, a transmission signal having a frequency of RF2 is generated by the second filter 144, and a transmission signal having a frequency of RF3 is generated by the third filter 146.

A frequency set is calculated based on the method described above, according to RF1, RF2, and RF3. Specifically, when the difference method and the high frequency designation are employed, the lowest frequency among RF1, RF2, and RF3 is set as the primary reference frequency, and the two remaining frequencies are set as the sub reference frequencies. A frequency, among three frequencies corresponding to RF1, RF2, and RF2, corresponding to the primary reference frequency, is set as the designated frequency, and the two remaining frequencies are set as the calculated frequencies. The above configuration is merely exemplary, and alternatively, in the present alternative configuration, the summation method or the low frequency designation may be employed.

In the embodiment of the present disclosure described above, a lower frequency or a higher frequency among two RFs is set as the criterion, but alternatively, an average frequency based on the two RFs may be set as the criterion. Further, in the embodiment of the present disclosure described above, the designated frequency for determining F0 may be varied according to the measurement objective and the measurement situation. Alternatively, F0 may be designated by the user. Another alternative configuration may be considered in which F1 and F2 are adaptively determined without the use of the designated frequency. Alternatively, a plurality of demultiplexing circuits corresponding to a plurality of groups of irradiation frequencies may be prepared, and a demultiplexing circuit suitable for a selected group of irradiation frequencies may be selectively used. Alternatively, for each of the transmission section and the reception section, a plurality of frequency converters connected in series may be provided. In this case, a stepwise frequency conversion is performed. Alternatively, a structure may be employed in which a plurality of demultiplexing circuits are provided in parallel with each other. In this case, the structure shown in FIG. 1 is provided for each of the demultiplexing circuits.

The invention claimed is:

1. A Nuclear Magnetic Resonance (NMR) measurement apparatus comprising:
  a mixer configured to multiply a transmission signal having a plurality of different frequency components by a local signal to generate a frequency-converted transmission signal under a condition for frequency conversion;
  a power amplifier configured to amplify the frequency-converted transmission signal and output an amplified transmission signal;
  a demultiplexing circuit including a plurality of filters arranged in parallel with each other, each filter of the plurality of filters having a different frequency characteristic, wherein the plurality of filters is configured to enable the amplified transmission signal to pass simultaneously in parallel through the plurality of filters to generate a plurality of transmission signals corresponding to a plurality of different irradiation frequencies, each of the plurality of transmission signals including a different component of respective irradiation frequencies of the plurality of different irradiation frequencies, and configured to output the plurality of transmission signals to an NMR detection circuit; and
  a controller configured to set the condition for frequency conversion, wherein the condition for frequency conversion is a condition for generating the plurality of different irradiation frequencies,
  wherein the plurality of transmission signals comprise a first transmission signal having a first irradiation frequency and a second transmission signal having a second irradiation frequency,
  wherein one of the first irradiation frequency and the second irradiation frequency is a primary reference frequency and another of the first irradiation frequency and the second irradiation frequency is a sub reference frequency,
  wherein a difference method or a summation method is employed as a frequency conversion method for the frequency conversion by the mixer,
  wherein the plurality of different frequency components of the transmission signal comprise a first frequency component having a first frequency and a second frequency component having a second frequency,
  wherein the condition for frequency conversion comprises the first frequency and the second frequency,
  wherein a frequency, among the first frequency and the second frequency, which corresponds to the primary reference frequency, is a designated frequency that is designated within a range of frequencies which the NMR measurement apparatus is configured to generate as an intermediate frequency,
  wherein a frequency, among the first frequency and the second frequency, which corresponds to the sub reference frequency, is a calculated frequency that is calculated within the range of frequencies,
  wherein the frequency of the local signal is calculated based on the primary reference frequency, the designated frequency, and the frequency conversion method,
  wherein the calculated frequency is calculated based on the sub reference frequency, the frequency of the local signal, and the frequency conversion method, and
  wherein the designated frequency is designated, such that the calculated frequency is not a negative frequency and does not exceed an upper limit of the range of frequencies.

2. The NMR measurement apparatus according to claim 1, wherein
  the frequency conversion method is the difference method,
  the designated frequency is a frequency exceeding ½ of the range of frequencies which the NMR measurement apparatus is configured to generate as the intermediate frequency, and
  the primary reference frequency is a lower frequency among the first irradiation frequency of the first transmission signal of the plurality of transmission signals and the second irradiation frequency of the second transmission signal of the plurality of transmission signals.

3. The NMR measurement apparatus according to claim 1, wherein
  the frequency conversion method is the difference method,
  the designated frequency is a frequency below ½ of the range of frequencies which the NMR measurement apparatus is configured to generate as the intermediate frequency, and
  the primary reference frequency is a higher frequency among the first irradiation frequency and the second irradiation frequency.

4. The NMR measurement apparatus according to claim 1, wherein
  the frequency conversion method is the summation method, the designated frequency is a frequency below ½ of the range of frequencies which the NMR measurement apparatus is configured to generate as the intermediate frequency, and the primary reference frequency is a lower frequency among the first irradiation frequency and the second irradiation frequency.

5. The NMR measurement apparatus according to claim 1, wherein the frequency conversion method is the summation method, the designated frequency is a frequency exceeding ½ of the range of frequencies which the NMR measurement apparatus is configured to generate as the intermediate frequency, and the primary reference frequency is a higher frequency among the first irradiation frequency and the second irradiation frequency.

6. The NMR measurement apparatus according to claim 1, wherein the plurality of filters comprise a first filter having a first frequency characteristic for generating the first transmission signal, and a second filter having a second frequency characteristic for generating the second transmission signal.

7. The NMR measurement apparatus according to claim 1, further comprising:

a probe having the NMR detection circuit;

a filter bank provided between the mixer and the power amplifier; and a bypassing path provided between the mixer and the power amplifier, and that bypasses the filter bank, wherein the bypassing path functions when the demultiplexing circuit is to function between the power amplifier and the probe, and the filter bank functions when the demultiplexing circuit is not to function between the power amplifier and the probe.

8. The NMR measurement apparatus according to claim 1, wherein during reception, the demultiplexing circuit functions as a combining circuit, and a combined reception signal is extracted from between the power amplifier and the demultiplexing circuit.

* * * * *